US007337407B1

(12) United States Patent
Ogami et al.

(10) Patent No.: US 7,337,407 B1
(45) Date of Patent: Feb. 26, 2008

(54) AUTOMATIC APPLICATION PROGRAMMING INTERFACE (API) GENERATION FOR FUNCTIONAL BLOCKS

(75) Inventors: Kenneth Y. Ogami, Bothell, WA (US); Matthew A. Pleis, Carnation, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 448 days.

(21) Appl. No.: 09/994,599

(22) Filed: Nov. 19, 2001

(51) Int. Cl.
*G06F 3/00* (2006.01)
*G06F 17/50* (2006.01)

(52) U.S. Cl. .................. 715/762; 715/964; 703/14
(58) Field of Classification Search ............. 345/519, 345/964; 703/14, 15; 715/762, 964
See application file for complete search history.

(56) References Cited

U.S. PATENT DOCUMENTS

| 5,673,198 | A | * | 9/1997 | Lawman et al. .............. 716/11 |
| 6,138,270 | A | * | 10/2000 | Hsu ........................... 717/125 |
| 6,460,172 | B1 | | 10/2002 | Insenser Farre et al. ...... 716/17 |
| 6,526,566 | B1 | * | 2/2003 | Austin ......................... 717/109 |
| 6,530,065 | B1 | * | 3/2003 | McDonald et al. ............ 716/4 |
| 6,631,508 | B1 | * | 10/2003 | Williams ....................... 716/8 |

OTHER PUBLICATIONS

Nilsson, Introduction to PSpice Manual for Electric Circuits Using OrCad Release 9.1, 2000, Prentice Hall, pp. vii, 1-13, 46, and 47.*

* cited by examiner

*Primary Examiner*—Tadesse Hailu
*Assistant Examiner*—Dennis G. Bonshock

(57) ABSTRACT

A method of generating an application programming interface (API) for an electronic circuit. A graphical user interface is displayed through which a user can initiate generation of the API. A component is selected from a plurality of components for placement in said electronic circuit. The component represents an implementable function in the electronic circuit. The component is configured using the graphical user interface. The data pertaining to the selected component and the configuration of the component is stored. The graphical user interface is utilized to access the stored data. The interface is initiated to invoke a processing of said data which causes a generation of the application programming interface. The application interface is for controlling the function of the component in said electronic circuit.

27 Claims, 11 Drawing Sheets

1000

```
┌─────────────────────────────────────────────────┐
│  DISPLAYING A GENERATED GRAPHICAL USER INTERFACE│
│  THROUGH WHICH A USER CAN INITIATE GENERATION   │
│                    OF AN API.                   │
│        (APPLICATION PROGRAMMING INTERFACE)      │
│                      1002                       │
└─────────────────────────────────────────────────┘
                        ↓
┌─────────────────────────────────────────────────┐
│  SELECTING A COMPONENT FOR PLACEMENT IN AN      │
│                 ELECTRONIC CIRCUIT.             │
│                      1004                       │
└─────────────────────────────────────────────────┘
                        ↓
┌─────────────────────────────────────────────────┐
│  CONFIGURING THE SELECTED COMPONENT VIA THE     │
│              GRAPHICAL USER INTERFACE.          │
│                      1006                       │
└─────────────────────────────────────────────────┘
                        ↓
┌─────────────────────────────────────────────────┐
│  STORING THE DATA THAT IS RELATIVE TO THE       │
│     SELECTED COMPONENT AND THE CONFIGURATION.   │
│                      1008                       │
└─────────────────────────────────────────────────┘
                        ↓
┌─────────────────────────────────────────────────┐
│    UTILIZING THE INTERFACE TO ACCESS THE        │
│                  STORED DATA.                   │
│                      1010                       │
└─────────────────────────────────────────────────┘
                        ↓
┌─────────────────────────────────────────────────┐
│  INITIATING THE INTERFACE TO INVOKE A PROCESSING│
│   OF THE DATA WHICH CAUSES A GENERATION OF THE  │
│         APPLICAITON PROGRAMMING INTERFACE.      │
│                      1012                       │
└─────────────────────────────────────────────────┘
```

FIGURE 10

AUTOMATIC APPLICATION PROGRAMMING INTERFACE (API) GENERATION FOR FUNCTIONAL BLOCKS

FIELD OF THE INVENTION

The present invention relates to providing APIs (application programming interfaces) for programmed electronic circuits. More specifically, the present invention provides a software application which automatically generates APIs relative to components in a programmed electronic device.

BACKGROUND OF THE INVENTION

A circuit designer determines the various functions that are necessary for proper operation of a programmable electronic device being created. Once the designer has determined the required functions, the functions are organized and placed in accordance with available resource constraints regarding the electronic device and the system into which the electronic device will be implemented.

A circuit designer further needs to determine the various interconnections between the functions and configure the input/output pins. Subsequently, the designer needs to configure the functions within the programmable electronic device. Conventionally performed manually, configuration includes placing the functions within the programmable electronic device, mapping the functions for connections, configuring multifunction input/output ports or pins which typically contain multiple registers that require programming. The programming of the registers configure the pin type and drive characteristics of the input/output pins.

Designers commonly use data sheets to describe the electronic circuit they designed and have configured. Subsequent to the configuration of the programmable electronic device, API's (application programming interfaces) are needed in order to interact with the electronic device to instruct the electronic device to perform its embedded functions. The programmer needs to know all of the registers and other technical information required to instruct the programmable electronic device to invoke the embedded functions, e.g., start timing, stop timing, etc. Manual programming is tedious and prone to programming errors and difficult to debug, the process of correcting errors within the programming.

Therefore, it would be advantageous to provide a method which provides an user friendly interface for circuit designing, configuration, and programming. It would be further advantageous to provide such a method that assists in the reduction of programming errors. It would be further advantageous to provide such a method which frees designers and programmers from remembering registers and other technical information, such as pin configurations, that invoke the embedded functions within a programmable electronic device.

SUMMARY OF THE INVENTION

Thus, the present invention provides a method which provides an user friendly interface for circuit designing, configuration, and programming. The present invention further provides such a method and which assists in the reduction of programming errors. The present invention further provides such a method which frees designers and programmers from remembering registers and other technical information, such as pin configurations, that invoke the embedded functions within a programmable electronic device.

Embodiments of the present invention provide a convenient user-friendly graphical user interface for designing, configuring, and programming electronic circuits and devices. Embodiments further provide for a method which provides a reduction in programming errors. Embodiments provide for such a method which does not require circuit designer to memorize registers and other technical information that invoke the embedded functions of programmable electronic circuits or devices.

These and other objects and advantages of the present invention will no doubt become obvious to those of ordinary skill in the art after having read the following detailed description of the preferred embodiments which are illustrated in the various drawing figures.

A method to generate APIs (application programming interface) for an electronic circuit is described. In a method embodiment, a graphical user interface is displayed through which a user can initiate generation of the API. A component is selected from a plurality of components for placement in said electronic circuit. The component represents an implementable function in the electronic circuit. The component is configured using the graphical user interface. The data pertaining to the selected component and the configuration of the component is stored. The graphical user interface is utilized to access the stored data. The interface is initiated to invoke a processing of said data which causes a generation of the application programming interface. The application interface is for controlling the function of the component in said electronic circuit.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 10 is a flow chart showing the steps in a process of generating an application programming interface, in accordance with one embodiment of the present invention.

DETAILED DESCRIPTION

Figure 1:
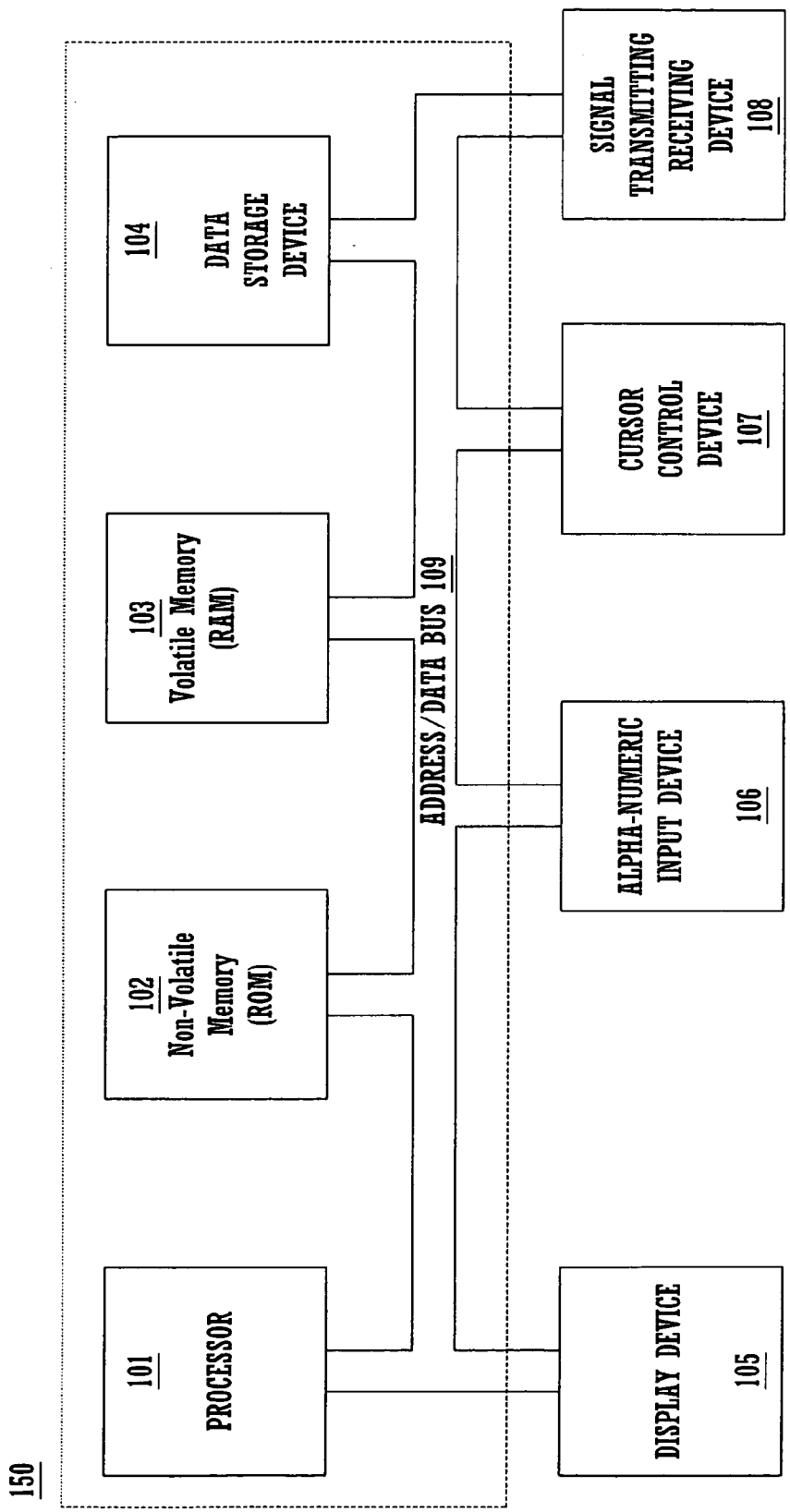
FIG. 1 is a block diagram of an exemplary computer system upon which embodiments of the present invention may be practiced.

A method of generating an interface for programming electronic devices is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Notation and Nomenclature

Some portions of the detailed descriptions, which follow, are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "configuring" or "initiating" or "providing" or "selecting" or "generating" or "accessing" or "utilizing" or "invoking" or "setting" or "placing" or "displaying" or the like, refer to the action and processes of a computer system or similar electronic computing device, that manipulates and transforms data represented as physical (electronic) quantities within the computer system's registers and memories into other data similarly represented as physical quantities within the computer system memories or registers or other such information storage, transmission or display devices.

The present invention is discussed primarily in the context of programming an electrical device, such as a microcontroller or an integrated circuit. However, it is appreciated that the present invention may be used to program other electronic devices that have the capability of being programmed. It is further appreciated that, in one embodiment, the programming of an electrical device is performed on a desktop or laptop computer system. It is also appreciated that the present invention can be used with other types of computer systems, e.g., mainframe computers, and portable computer devices, e.g., handheld computers (PDAs), that can provide programming of electronic devices.

It is further appreciated that the present invention is embodied in PSOC and/or PROGRAMMABLE SYSTEM ON A CHIP microcontrollers and in PSOC DESIGNER software, available from Cypress MicroSystems, Inc., of Bothell, Wash. It is also appreciated that PSOC DESIGNER software provides a graphical user interface to facilitate the programming of electronic devices, such as microcontrollers, integrated circuits, and the like, such as is described in co-pending U.S. patent application Ser. No. 09/989,570, filed on Nov. 19, 2001, entitled "METHOD FOR FACILITATING MICROCONTROLLER PROGRAMMING", by Bartz, et al., and assigned to the assignee of the present invention and incorporated herein by reference.

Exemplary Computer System

With reference to FIG. 1, portions of the present invention are comprised of computer-readable and computer executable instructions which reside, for example, in computer-readable media of an electronic system such as a computer system. FIG. 1 illustrates an exemplary computer system 150 upon which embodiments of the present invention may be practiced. It should be appreciated that computer system 150 of FIG. 1 is an exemplary representation of a number of different computer systems and electronic devices in which the present invention can operate, including but not limited to desktop computer systems and/or laptop computer systems.

Computer system 150 includes an address/data bus 109 for communicating information, a processor 101 coupled with bus 109 for processing information and instructions, a non-volatile memory (ROM—read only memory) 102 coupled with bus 109 for storing static information and instructions for processor 101, and a volatile memory (RAM—random access memory) 103 coupled with bus 109 for storing information and instructions for the processor 101. Computer system 150 also includes data storage device 104 such as a magnetic or optical disk and disk drive coupled with bus 109 for storing information and instructions. Data storage device 104 can include one or more removable magnetic or optical storage media, e.g., diskettes, tapes, SD (secure digital) cards, MMC (multi-media cards), which are computer readable memories. Memory units of computer system 150 include volatile memory 103, non-volatile memory 102, and data storage device 104.

Electronic device 150 of FIG. 1 can further include an optional signal generating device 108, e.g., a wired or wireless network interface card (NIC) coupled with bus 109 for interfacing with other computer systems and/or other electronic devices. Electronic device 150 can also include an optional alphanumeric input device 106 which includes alphanumeric and function keys coupled with bus 109 for communicating information and command selections to processor 101. An optional display device 105 can be coupled with bus 109 for displaying information to a computer user. Display device 105 may be a liquid crystal display (LCD), a cathode ray tube (CRT), a flat panel display such as an FED (field emission display), an electronic paper display, or nearly any other display device suitable for creating and generating graphic images and alphanumeric characters recognizable to a user.

Electronic device 150 also includes an optional cursor control or directing device 107 coupled with bus 109 for communicating user input information and command selections to processor 101. Cursor control device 107 allows the user to dynamically signal the two dimensional movement of a visible symbol (cursor) on a display screen of display device 105. Many implementations of cursor control device 107 are known in the art, including but not limited to, a trackball, mouse, optical mouse, touch pad, touch screen, joystick, or special keys on alphanumeric input device 106 capable of signaling movement of a given direction or manner of displacement. Alternatively, it is appreciated that a cursor can be directed and/or activated via input from alphanumeric input device 106 using special keys and/or key sequence commands.

Figure 2:
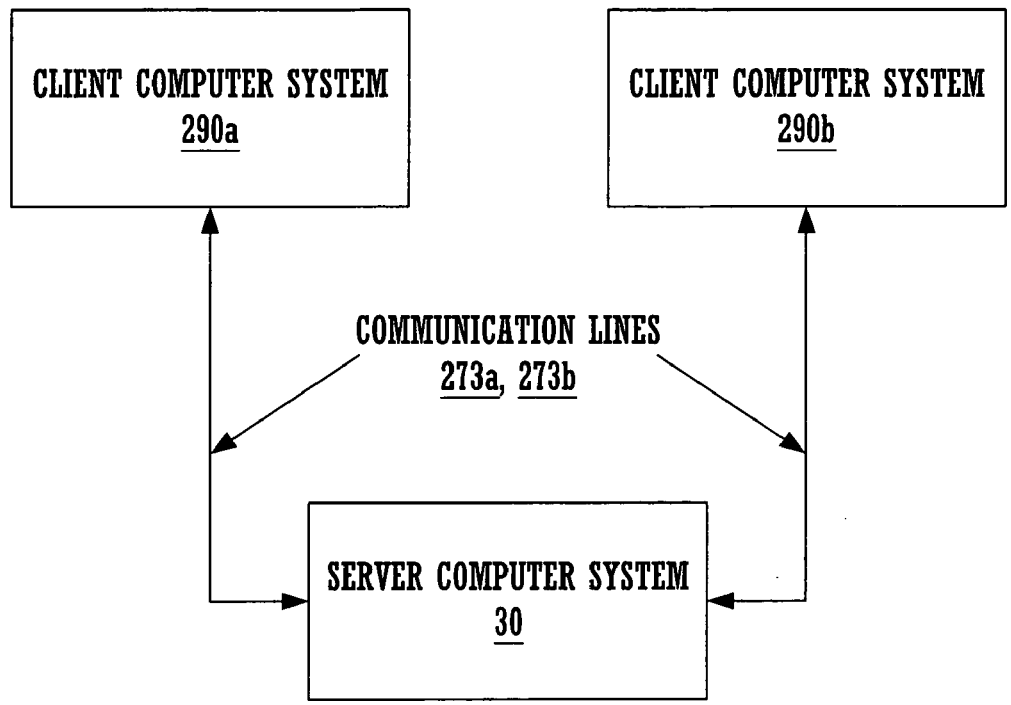
FIG. 2 is a block diagram of a client-server network environment upon which embodiments of the present invention may be practiced.

FIG. 2 is a block diagram illustrating an exemplary client-server computer system network 275, within which embodiments of the present invention may be practiced. Network 275 may be a communication network located within a firewall of an organization or corporation (an "Intranet"), or network 275 may represent a portion of the World Wide Web or Internet. Client (or user) computer systems 290a and 290b and server computer system 30 are communicatively coupled via communication lines 273a and 273b; the mechanisms for communicatively coupling computer systems over the Internet or over Intranets are well-known in the art.

It is appreciated that in one embodiment, client computer systems 290a and 290b and server computer 30 have an instancing of the device programming software disposed therein. It is appreciated that, in another embodiment of the present invention, the device programming software can be disposed in computer system 290a and in the server computer 30. Accordingly, if a company creates a new component/user module/device, or if an existing component/user module/device is modified by that particular company, the information regarding that specific component/user module/device can be made available to that company's clients for updating. In one embodiment, that updated information can be acquired by the client via the Internet. In one embodiment, the data can be configured to be readable by a handheld device, e.g., a PDA (personal digital assistant), such that a PDA can be used to acquire updated or new information, and then transferred to the computer system upon which the device programming software is disposed, e.g., computer system 150 of FIG. 1. Once the new or updated information is acquired by the client, the information can be stored in a data storage device, data storage device 104 of FIG. 1.

Figure 3:
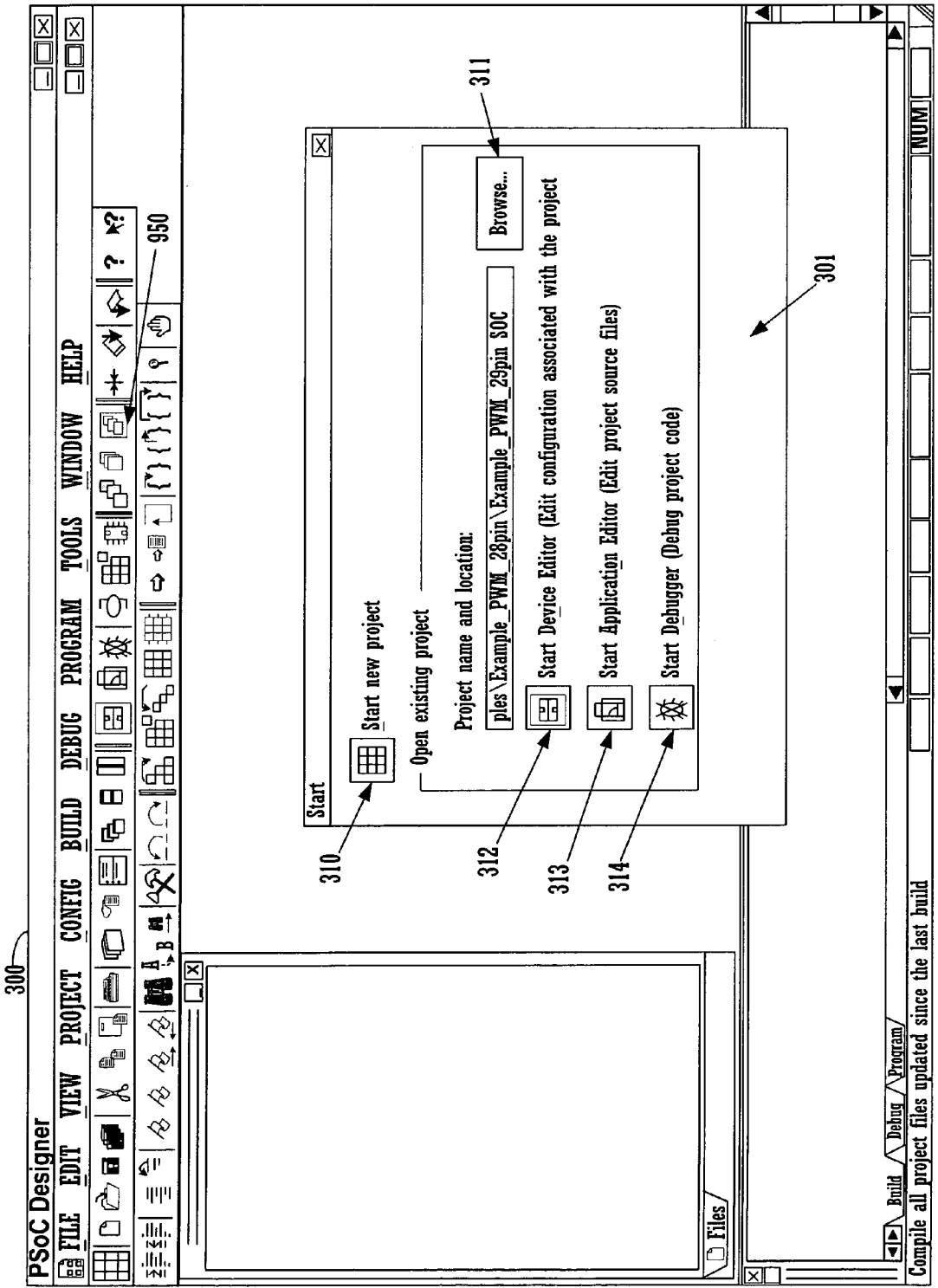
FIG. 3 is a screen shot of an opening display screen, in accordance with one embodiment of the present invention.

FIG. 3 is a screen shot of a starting page 300 of the device programming software, in one embodiment of the present invention. Starting page 300 is displayed to a user when the device programming software is initiated. Within starting page 300 is start selection box 301, which provides multiple selections from which a user may choose. In one embodiment, a user may start a new project by clicking on select button 310, or alternatively, a user may open an existing project via the browse button 311. Browse button 311 enables a user to retrieve a project that is stored within a memory unit, e.g., data storage device 104 of FIG. 1. Subsequent to selection of the project to be opened, via browser button 311, a user then selects a subsystem, e.g., function configuration subsystem 312, source file editing subsystem 313, or debugging subsystem 314 of FIG. 3, for utilization in conjunction with the project with which a user is working. The subsystems within the device programming software are dedicated interfaces for providing specific programming functionality. In the instance within the device programming software, there are, in one embodiment, three such subsystems.

The first subsystem is a function configuration subsystem (e.g., the DEVICE EDITOR subsystem) 500 of FIGS. 5, 6A, 6B, and 7. The function configuration subsystem is utilized for selecting user modules, placing user modules, setting user parameters, selecting pin values, as described in FIG. 4, and for generating user project files, e.g., user project files 408 of FIG. 4.

Figure 9:
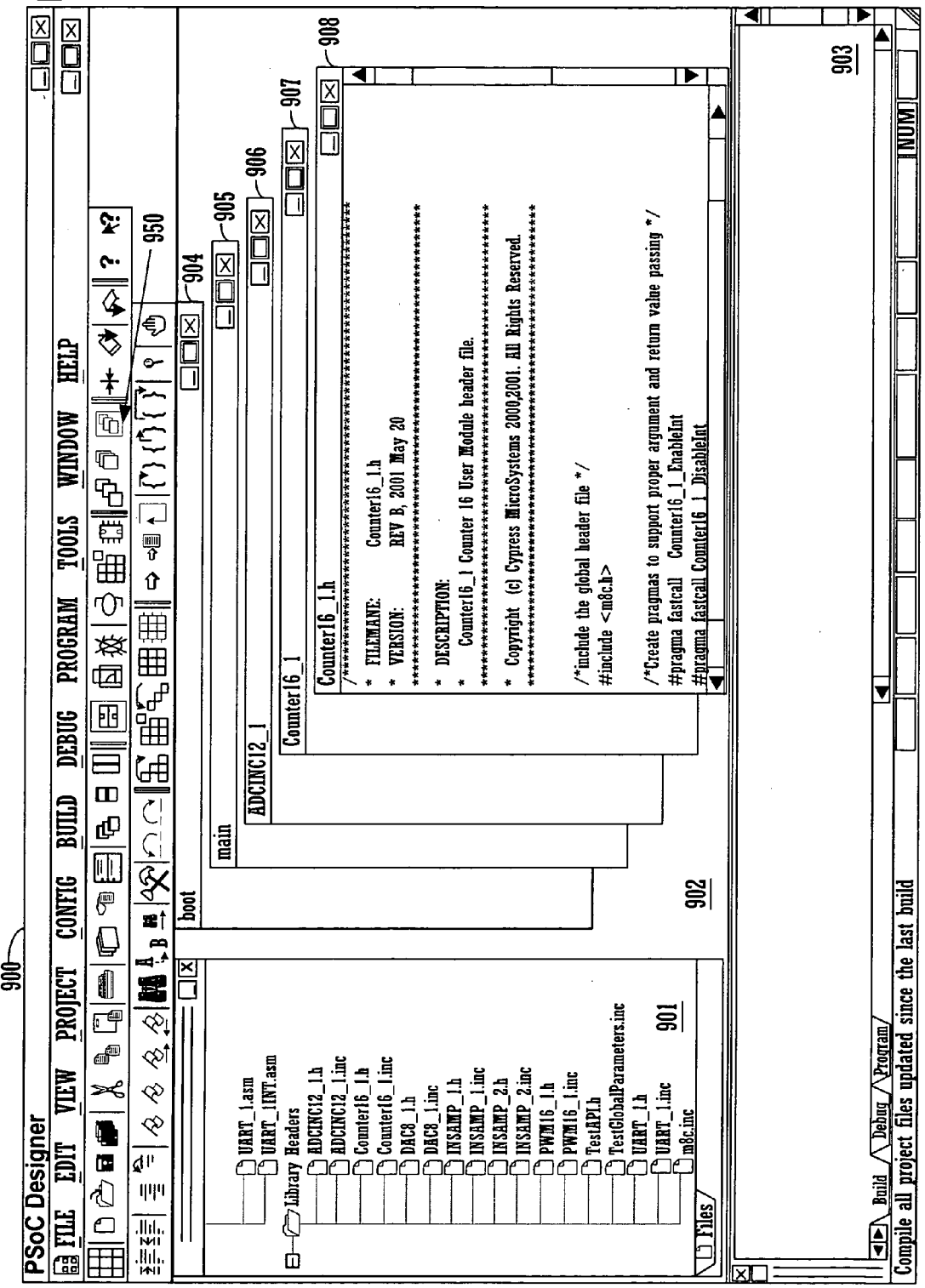
FIG. 9 is a screen shot depicting a displayed source file editing subsystem, in accordance with one embodiment of the present invention.

The second subsystem is a source file editing subsystem (e.g., the APPLICATION EDITOR subsystem) 900 of FIG. 9. The source file editing subsystem is for programming the desired functionality into the device, subsequent to the completion of the configuration process. The source file editing subsystem is where source-code programming occurs. The source file editing subsystem source-code programming includes, but is not limited to, editing or modifying files, creating or adding files, removing or deleting files, compiling/assembling files, and building the project. Building the project links all of the programmed functionality of the source files, including device configuration, and loads it into a .rom file, which is the file that a user downloads for debugging and/or device programming.

The third subsystem is a debugging subsystem, e.g., DEBUGGER 314 of FIG. 3. The debugging subsystem allows a user to test the project in a hardware environment while viewing and debugging device activity in a software environment.

Figure 5:
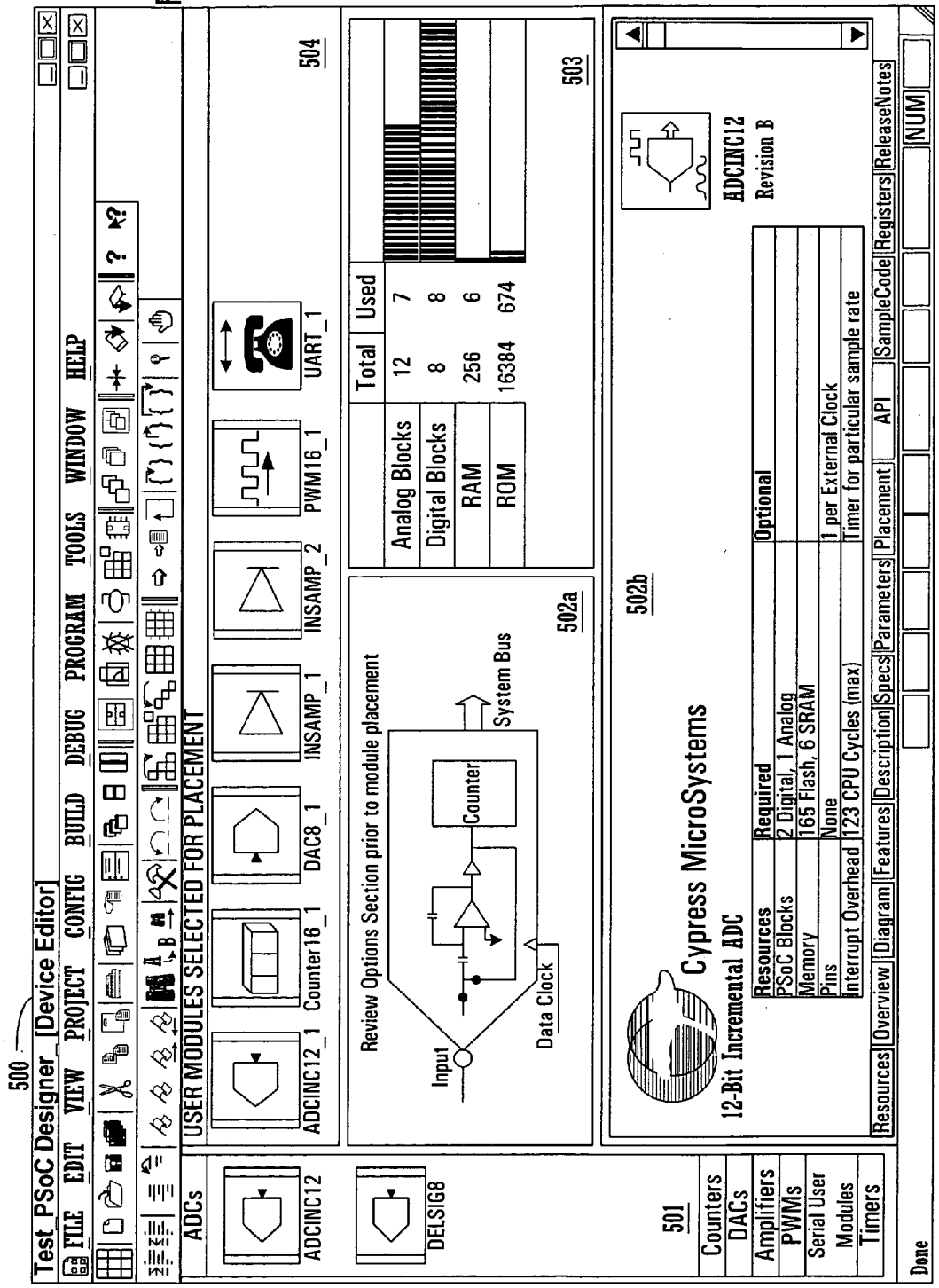
FIG. 5 is a screen shot depicting a function configuration subsystem in a selection view, in accordance with one embodiment of the present invention.

Still referring to FIG. 3, it is appreciated that the resulting graphical user interface that is displayed to a user is dependent upon which of the subsystems has been selected by a user. In one embodiment, FIG. 5 depicts the graphical user interface that is displayed to a user when the subsystem device editor 312 is selected. It is appreciated that alternative graphical user interfaces are generated which correspond to the subsystem selected by a user.

Figure 4:
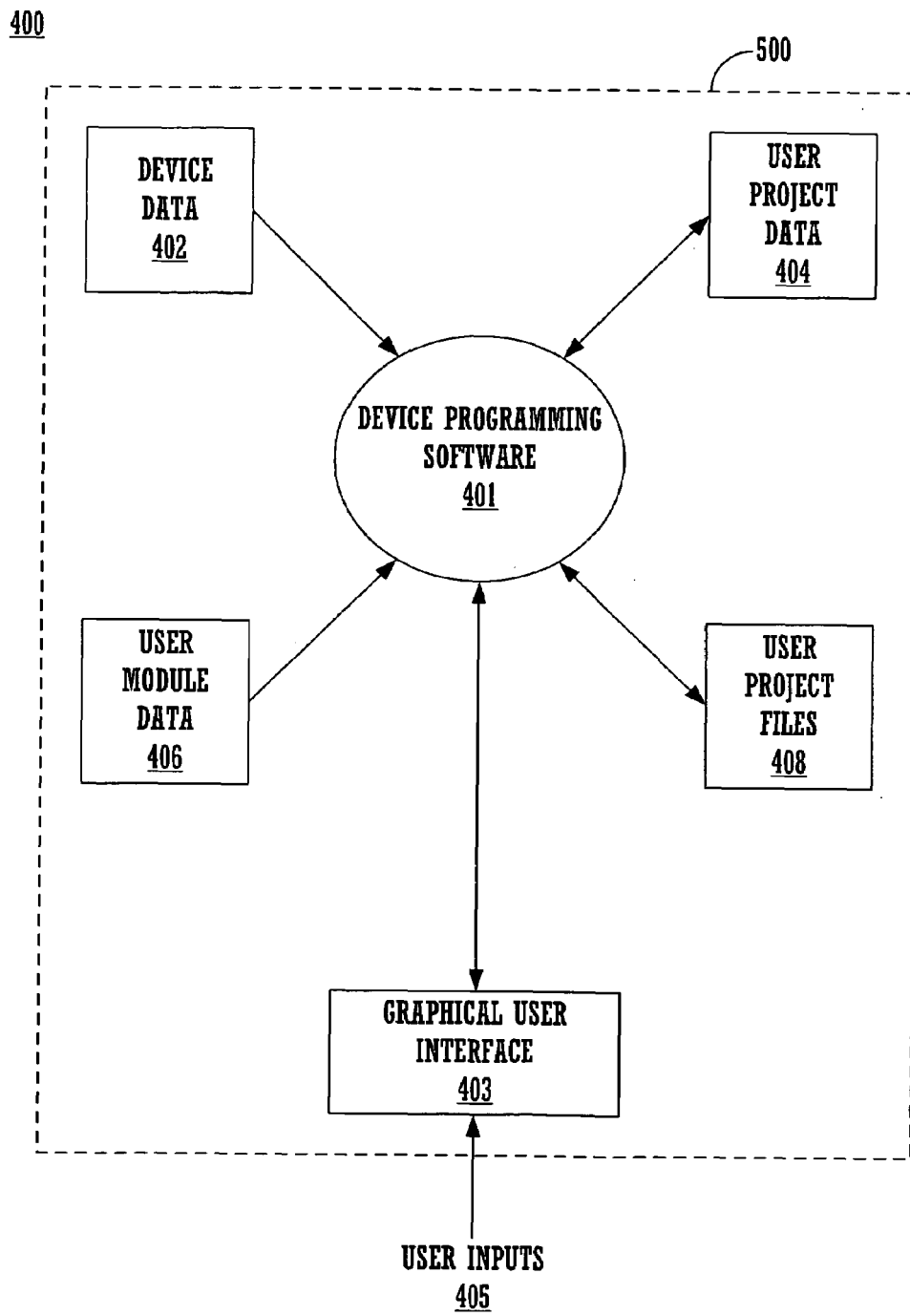
FIG. 4 is a block diagram of an overview of a function configuration subsystem, in accordance with one embodiment of the present invention.

FIG. 4 is a block diagram for describing an overview of the functionality of a function configuration subsystem (e.g., the DEVICE EDITOR subsystem) 500 of FIG. 5, a subsystem of the device programming software (e.g., PSOC DESIGNER software), in one embodiment of the present invention. The function configuration subsystem 500 provides to a user the ability to configure a programmable electronic device, such as a microcontroller, with specific functions as determined by a user. Graphical user interface 403, such as those depicted in FIGS. 5, 6A, 6B, and 7, provides an information-rich environment to a user during the editing process. In one embodiment, function configuration subsystem 500 outputs a user project data file, e.g., user project data file 404 of FIG. 4. In one embodiment, function configuration subsystem 500 outputs a set of user project files, e.g., user project files 408. It is appreciated that user project data file 404 and user project files 408 can be built and debugged as an embedded application.

Still referring to FIG. 4, in one embodiment, steps to configure a programmable electronic device, e.g., a microcontroller, include creating a new project based upon a selected part. It is appreciated that the data for the selected part can, in one embodiment, be drawn from device data 402. Subsequent to creating a new project, user modules are selected to be included in the project. It is appreciated that the data for the selected user modules can, in one embodiment, be drawn from user module data 406. User modules can include, but are not limited to UARTs (universal asynchronous receiver transmitters), counters, amplifiers, timers, digital to analog converters, and analog to digital converters. The selected user modules are then placed on the part. The placement of each of the user modules on the part triggers a dynamic update of the user project data, e.g., user project data 404. Parameters for each of the placed user modules are then set, which further triggers a dynamic update of user project data 404. Pin values are then selected for connection to the appropriate user modules. Subsequent to pin value selection, the user project files, e.g., user project files 408, are generated and the user project data, e.g., user project data 404, is saved.

Still referring to FIG. 4, GUI 403, through which a user observes and inputs their changes, e.g., user inputs 405, is driven by device data 402 and user module data 406, in one embodiment of the present invention. It is appreciated that user project data 404 contains sufficient information, such that, in one embodiment, when that information is combined with device data 402 and user module data 406, user source files can be produced. In one embodiment, user source files can include, but are not limited to, initialization data and routines that realize the configuration when an embedded application is started. Also included in user source files are, in one embodiment, API functions that a user can utilize to control access the user modules. Further included in user source files is a boot file which contains an interrupt vector table. It is appreciated that the interrupt vector table is determined by the placement of the user modules.

It is noted that embodiment of the present invention are drawn to providing an automatic generation of the above mentioned application programming interfaces (APIs) for controlling the embedded functions within an electronic circuit or device, e.g., a programmable electronic device such as a microcontroller. In one embodiment, the generated API is predicated upon, but not limited to, the intended functionality of the electronic circuit or device being developed, the functions contained within the electronic device, the placement and configuration of the functions, the function connections with other functions and with the electronic device, and the resources of the electronic device and the resources of the system into which the electronic device is to be implemented.

FIG. 5 depicts, in one embodiment, function configuration subsystem 500, a graphical user interface that is generated in response to a user selecting the DEVICE EDITOR subsystem 412 of the device programming software (e.g., PSOC DESIGNER software), as described in FIG. 3. Within the displayed interface of function configuration subsystem 500, there are several active windows. It is appreciated that the subsystems, as described in FIG. 3, comprise multiple active windows. It is further appreciated that each of the subsystems contain their own particular active windows. It is also appreciated that, in one embodiment, a subsystem may have various different active windows which are independently generated depending upon which task a user is performing or which view a user has chosen within the selected subsystem.

Still referring to FIG. 5, function configuration subsystem 500 is shown in a user module selection view, and to the left is user module window 501, which displays, in this embodiment, the user modules or components which are available to be utilized in the current project. In one embodiment, user modules/components can include, but are not limited to, ADCs, DACs, timers, PWMs, and so on. It is through this view that the user modules/components for the current project are selected.

To the right of user module window 501 are user module information windows 502a and 502b. In this embodiment, user module information window 502a shows a schematic diagram of a selected module, e.g., an ADCINC12_1, and user module information window 502b shows the data of the selected module. In user module information window 502b, shown is the specific technical information related to the selected user module/component. Additionally, as can be seen along the bottom of window 502b, there are multiple select tabs which, when selected, generate data relative to that subject. For example, if a user selects "Specs" from the tabs, the device programming software will display data regarding the specifications of the selected module. It is appreciated that in the event any of the data related to the selected module, in this example, ADCINC12_1 is changed, that updated information is displayed in user module information windows 502a and 502b, respectively.

Referring still to FIG. 5, to the right of window 502a and above window 502b is resource manager window 503, in one embodiment. Resource manager window 503 displays the available resources, e.g., RAM, ROM, and digital blocks. Window 503 also displays the amount of those resources which are being used/consumed by the selected module. Above window 502a and window 503 is user module selection window 504. Window 504 displays those modules that are being utilized in the current project. Window 504 indicates seven user modules are being utilized in the current project. It is appreciated that a project can have a fewer number of modules or a greater number of modules. The number of modules is dependent upon the requirements of a particular project. It is further appreciated that as each module is selected, a graphic representing the selected module is dynamically placed in user module selection window 504. It is appreciated that the data regarding the selected user modules/components is stored, e.g., in user module data 406 of FIG. 4.

Figure 6A:
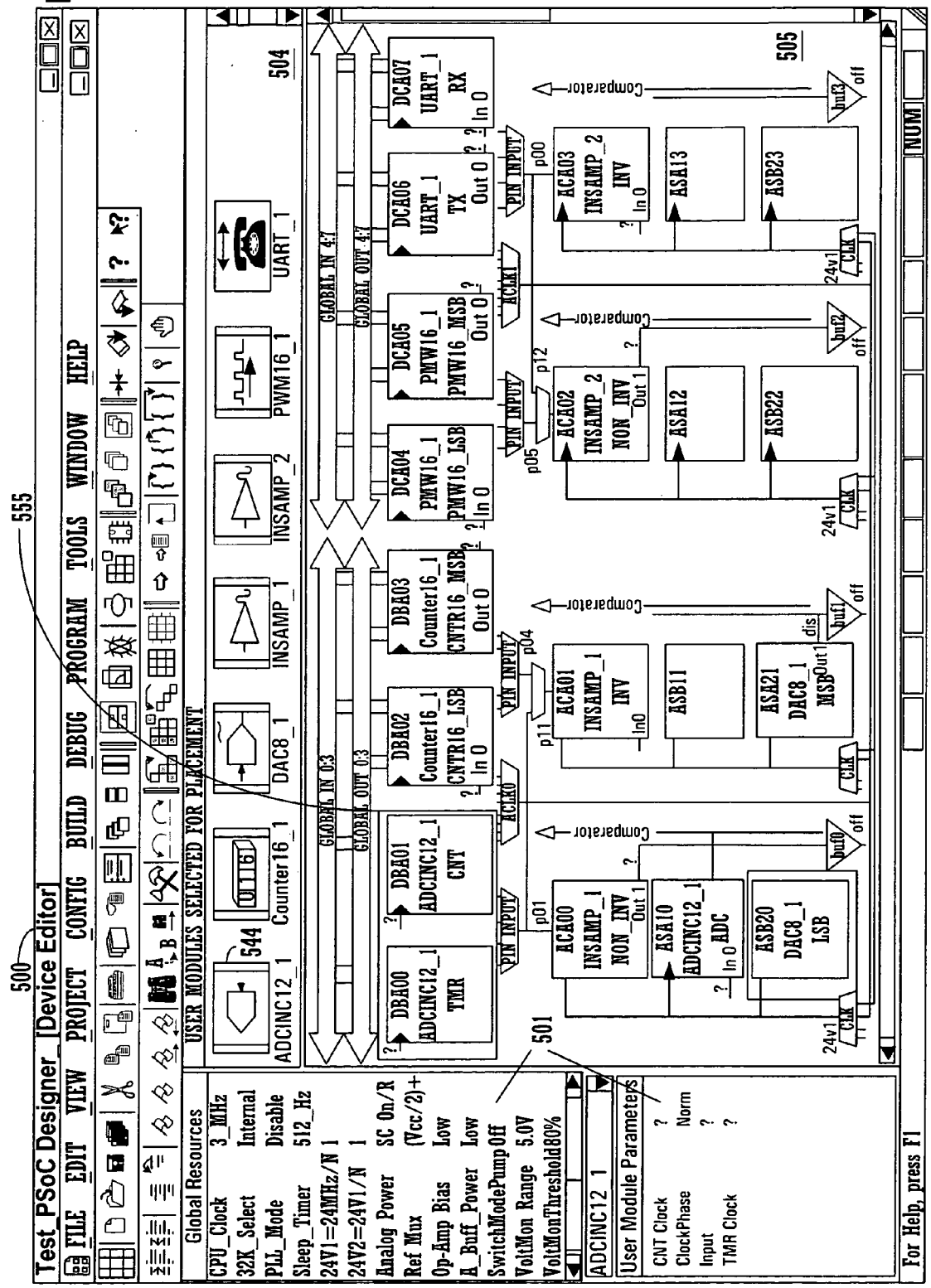
FIG. 6A is a screen shot depicting a function configuration subsystem in a placement view, in accordance with one embodiment of the present invention.

FIG. 6A shows, in one embodiment, function configuration subsystem 500 in a module placement view. It is through this view that the selected user modules/components, as described in FIG. 5, are placed. In this embodiment, window 501 displays the global resources and user module resources relative to the placement of the selected modules for the current project. The global resources are hardware settings that determine the underlying operation of the part (for the entire application). Global resources can include parameters such as, CPU-Clock, which designates the processing speed of the current project. To the right of each of the global resources are corresponding values which can be adjusted in accordance with available values and requirements of the current project. Adjusting the values requires a simple click on the value to generate a list of available values for that particular resource.

In this embodiment, user module selection window 504 is analogous to window 504 of FIG. 5, and is analogously disposed. Beneath window 504, in this embodiment, is placer view window 505. Placer view window 505 shows the placement of the modules within the current project.

Still referring to FIG. 6A, module ADCINC12_1, highlighted within window 504 and indicated by arrow 544, is shown to be placed in blocks DBA00 and DBA01, respectively, as indicated by the checkered pattern surrounding blocks DBA00 and DBA01, and by arrow 555. Additionally, the parameters for the selected user module/component, ADCINC12_1 are shown in the bottom portion of window 501. A displayed question mark indicates unconfigured parameters for that module/component. It is appreciated that for the blocks in placer view window 505 that have modules placed therein, each has the corresponding module identification, e.g., blocks DBA00 and DBA01 indicate that module ADCINC12_1 is thusly placed.

Figure 6B:
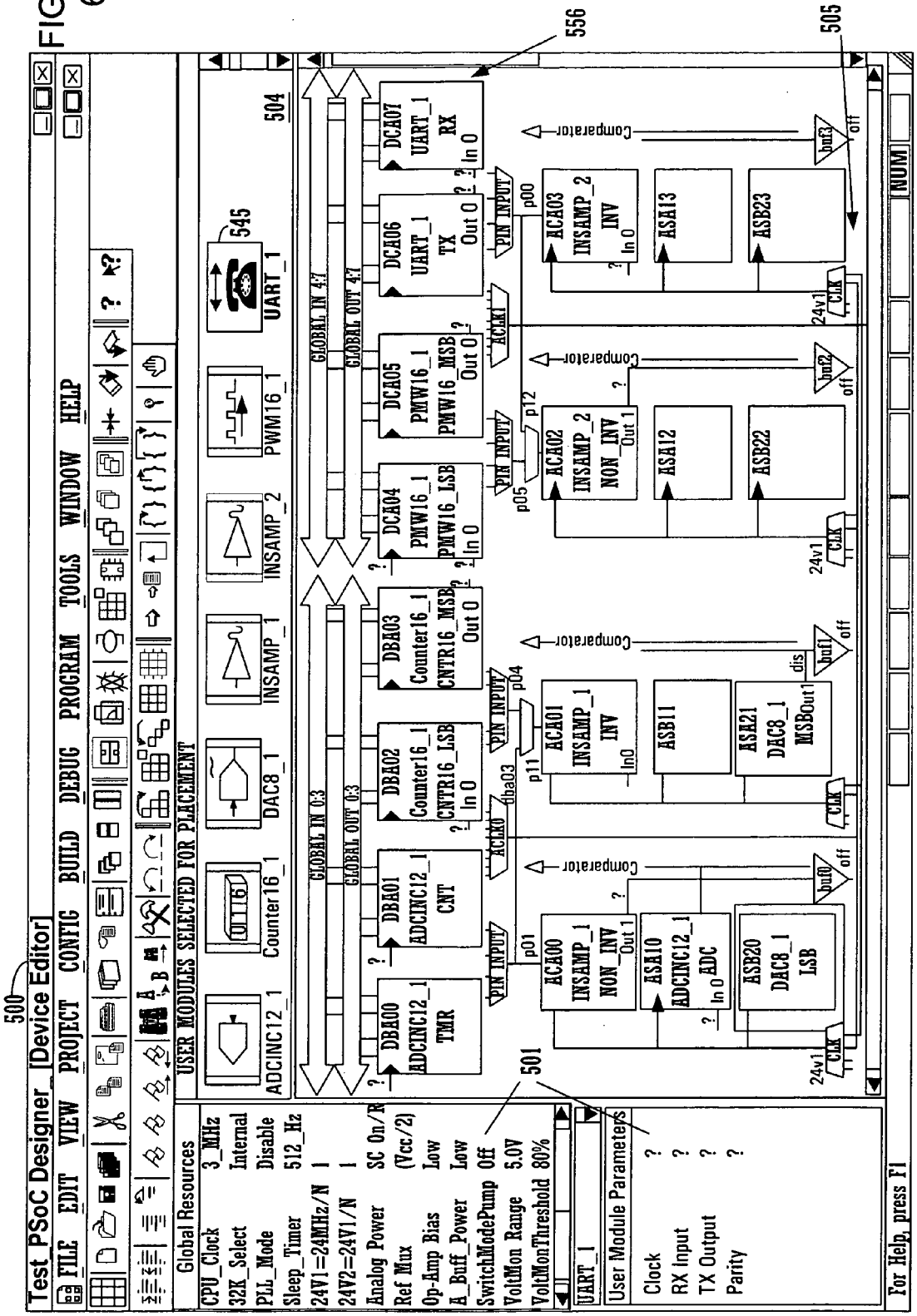
FIG. 6B is a sequential screen shot of the function configuration subsystem in FIG. 6A.

FIG. 6B, analogous to FIG. 6A, shows the placement of module UART 1, as indicated by the highlighting of UART1 and arrow 545, within user module selection window 504. UART1 is shown to be placed in blocks DCA06 and DCA07, respectively, as indicated by the surrounding checkered pattern and by arrow 556, as seen directly beneath window 504, on the right side of window 505. It is appreciated that as each module is selected and placed, its placement location is graphically shown to a user. It is further appreciated that if a module was to be placed in a different block, that would be dynamically reflected in the display. As described above, the blocks where UART 1 is placed, DCA06 and DCA07 show the module identification. It is appreciated that the data related to the placement of the selected user modules/components are stored, e.g., in user project data 404 of FIG. 4.

Figure 7:
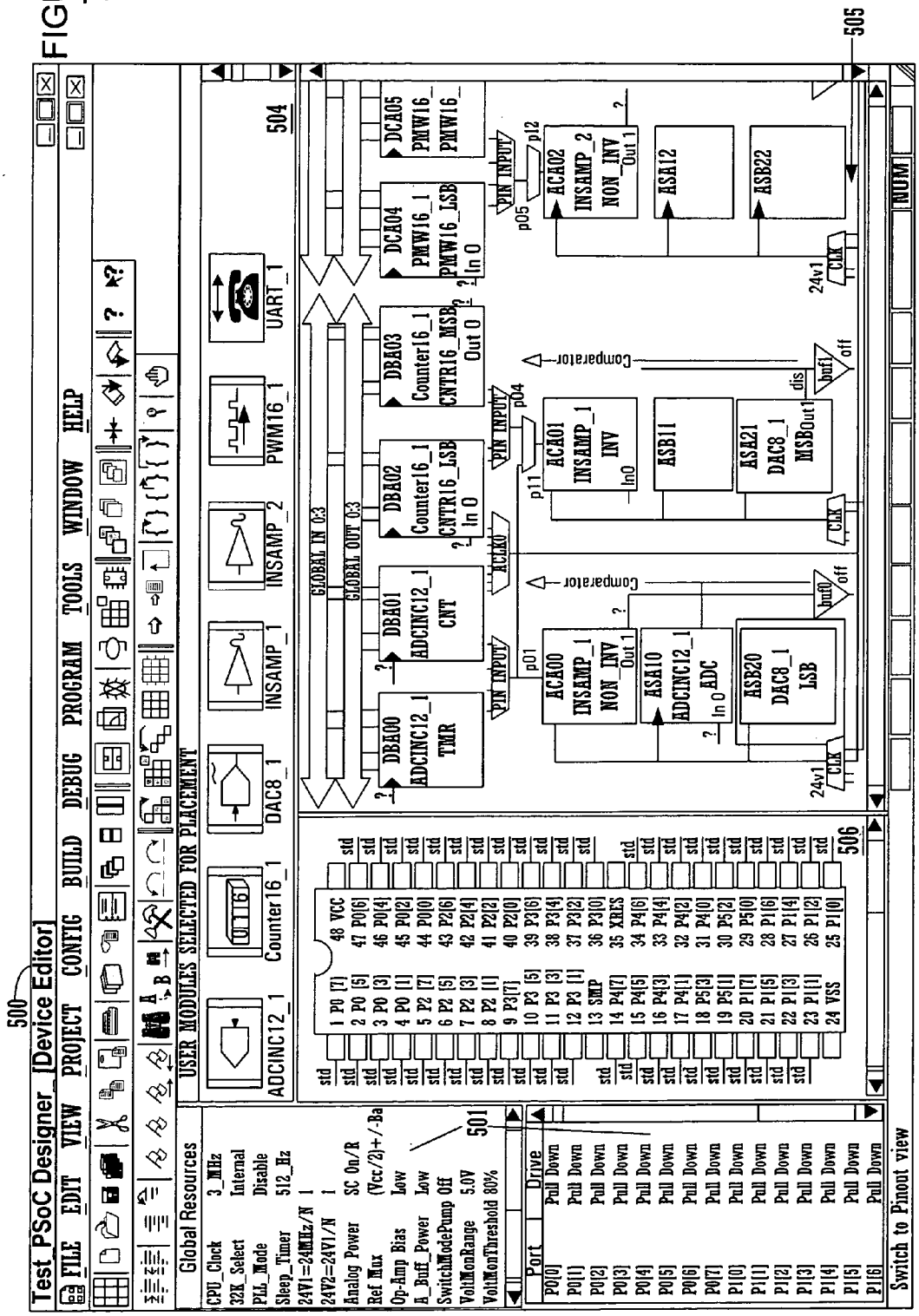
FIG. 7 is a screen shot depicting a function configuration subsystem in a pin-out view, in accordance with one embodiment of the present invention.

FIG. 7 shows function configuration subsystem 500 in a pin-out view, in one embodiment. It is through this view that the configuration of the pins, e.g., connections, pin types, and drive characteristics are determined. Active window 501 displays global resources and port and drive pin configurations for the corresponding pin numbers on an electronic circuit shown to the right of window 501, in pin-out view window 506. In this embodiment, the electronic circuit is shown to be two-sided and containing 48 pins. It is appreciated that the pin-out view is dependent upon the selected part. For example, if the selected part in the current project was a four-sided circuit with 44 pins, instead of the two-sided part with 48 pins, as shown, the pin-out view would generate a representation of that part that would show four sides with eleven pins on each side. In another example, if the selected part in the current project was a ball grid array, that, too, would be graphically represented in pin-out view window 506.

Still referring to FIG. 7, each of the pins are configurable by, in one embodiment, selecting the appropriate pin in a pin-out view window, e.g., pin-out view window 506. Configuring the pins can also be achieved by selecting the desired pin from the port and drive portion of window 501. In either instance, when a pin is selected, a pop-up menu is generated that shows the options available for the selected pin. Additionally, once the options relative to the pin are chosen, the results are dynamically displayed in the port and drive configuration portion of window 501 and graphically represent in placer view 505. Further, subsequent to the options chosen for the selected pin number, connection information is also dynamically displayed within placer view window 505. It is appreciated that the data regarding pin placement, connection, and configuration is stored, e.g., in user project data 404 of FIG. 4.

Figure 8:
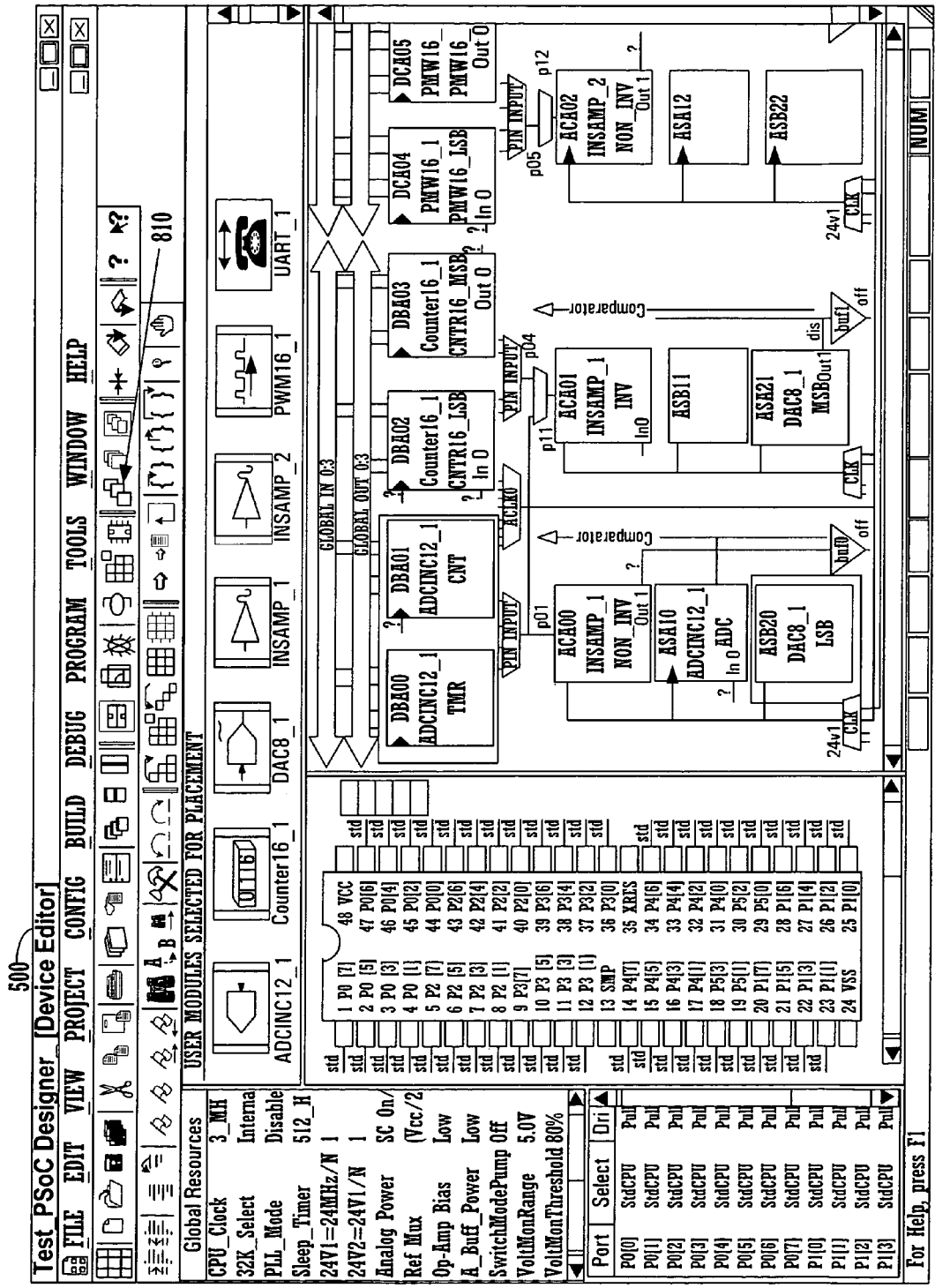
FIG. 8 is a screen shot depicting a function configuration subsystem used to initiate a generation of an application programming interface, in accordance with one embodiment of the present invention.

Subsequent to completing the selection, placing, and configuration of the user modules/components in the microcontroller, a user needs to generate the APIs (application programming interface) for controlling the user modules of the current project. FIG. 8 is a screen shot depicting the ease with which a user can initiate the generation of the API.

FIG. 8 shows function configuration subsystem 500 in pin-out view. To initiate the generation of API related to the current project, a user just clicks on generate application button 810. Clicking generate application button 810 causes the device programming software to instruct the computer system upon which the device programming software is loaded, e.g., computer system 150 of FIG. 1, to process the data that has been stored, e.g., device data 402, user project data 404, and user module data 406. The device programming software incorporates the above described data and existing assembly-source and C compiler code (including the project library source, e.g., PSocConfig.asm in source tree window 901 in FIG. 9) and generates an API (application programming interface) shell, which in one embodiment can include an ISR (interrupt service routine) shell, and which is used by application programmers to cause the user module to do specific functions.

It is appreciated that generate button 810 does not have to be selected in a function configuration subsystem, e.g., DEVICE EDITOR subsystem 500 of FIG. 8, to generate the APIs. It is known by the source file editing subsystem, e.g., source file editing subsystem 900 of FIG. 9, that the most current/up-to-date APIs have not been generated, and source file editing subsystem 900 will, in one embodiment, initiate API generation when the project is built, e.g., selecting build button 950 of FIG. 9.

The APIs are, in one embodiment, in the form of .asm (editable assembly language source file), .h (editable assembly language include/header file), and .inc (editable c-language include file) files. It is appreciated that these files are editable, such that a user can alter the contents. In one embodiment, these files can be used to perform common functions that are required to interact with the user module (e.g., how to start the timer, how to stop the timer, how to interact with the timer, etc.). Further, the generation processes receive setting information from a parameterization block are slightly altered thereby such that the proper settings are realized. These files provide the device-interface and interrupt-activity framework for source programming. The API and ISR files can be accessed in a source tree, e.g., source tree window 901 of FIG. 9. In addition, the device programming software has further created a data sheet based upon the configurations from function configuration subsystem 500 of FIGS. 5, 6A, 6B, and 7.

By using the automatically generated APIs, a user need not be aware of all of the low level registers and other low level technical information required to instruct the user module to invoke its function. The user simply needs to interact with the APIs which are written in a higher level of abstraction.

It is appreciated that generate application button 810 in FIG. 8 can be activated from within any of the three function configuration subsystem window views, e.g., the selection view as shown in FIG. 5, the placement view as shown in FIGS. 6A and 6B, and the pin-out view as shown in FIG. 7.

FIG. 9, shows, in one embodiment, a screen shot depicting activating source file editing subsystem 900. To the left is source tree window 901, a hierarchical display of the files generated by clicking on generate application button 810. To the right is source-file editing window 902, which displays those files in source tree window 901 for facilitating viewing and editing of the source files. Along the bottom of the source file editing subsystem interface is status window 903, which displays error messages if there are code problems that occur when the files are compiled and built.

Still referring to FIG. 9, shown in source-file editing window 902 are assorted files, e.g., files 904, 905, 906, 907, and 908 that were generated when generate application button 810 was selected. The top most file within window 903 is a boot.asm file, e.g., boot.asm 904, which is updated from its default name, boot.tpl. Each project receives it own particular boot.asm. When Boot.asm is updated, it reflects the current project configurations and which also includes a jump table for interrupt handlers.

Directly below boot.asm 904 is a main.asm, e.g., main.asm 905. Main.asm is also present in each project, and resolves the external reference from the boot sequence. When initially created upon new project creation, the "_main" function contains a simple forever loop.

Beneath main.asm 905 are ADCINC12_1.*inc* 906, Counter16_1.*inc* 907, and Counter16_1.*h* 908, respectively. Each was retrieved from source tree window 901 for viewing and editing. By retrieving a source file, it is convenient to edit the generated APIs for customization of the functions they perform, and how the function is performed. It is appreciated that the .asm, .h, and .inc files are named to reflect the user module/component for which they are associated.

It is appreciated that for a user to compile and build the source code, they need to simply click on build button 950, also of FIG. 9.

The operating platform upon which embodiments of the present invention may be practiced is, in one embodiment, a MICROSOFT WINDOWS operating platform commercially available from Microsoft Corporation of Redmond, Wash. However, it is appreciated that other operating platforms may be used to practice embodiments of the present invention.

FIG. 10 is a flowchart 1000 of steps performed in accordance with one embodiment of the present invention for providing a generation of an application programming interface (API) generation for an electronic circuit. Flowchart 1000 includes processes of the present invention which, in one embodiment, are carried out by processors and electrical components under the control of computer readable and computer executable instructions. The computer readable and computer executable instructions reside, for example, in data storage features such as computer usable volatile memory 103 and/or computer usable non-volatile memory 102 of FIG. 1. However, the computer readable and computer executable instructions may reside in any type of computer readable medium. Although specific steps are disclosed in flowchart 800, such steps are exemplary. That is, the present invention is well suited to performing various other steps or variations of the steps recited in FIG. 10. Within the present embodiment, it should be appreciated that the steps of flowchart 1000 may be performed by software, by hardware or by any combination of software and hardware.

In step 1002 of FIG. 10, a graphical user interface is displayed, such as function configuration subsystem 500 of FIG. 5, through which a user can initiate the generation of the API (application programming interface), in one embodiment of the present invention.

In step 1004 of FIG. 10, a component is, in one embodiment, selected from a number of available components, such as those graphically presented in user module window 501 of FIG. 5. It is appreciated that the component represents an implementable function in said electronic circuit being designed.

In step 1006 of FIG. 10, the selected component, from FIG. 5, is configured, in one embodiment, by using the graphical user interface. The process of configuring the selected component/user module comprises placing the component within operation blocks of the electronic circuit being designed, as shown and described in placer view window 505 of FIGS. 6A and 6B.

Configuring the component further comprises, in one embodiment, determining pin placement, pin types and drive characteristics, as shown in pin-view window 506, user module window 501, and placer view 504 of FIG. 7.

In step 1008 of FIG. 10, the data regarding the current project is seamlessly stored. In one embodiment, the data relating to the electronic device being designed is stored in device data 402 and user project data 404 of FIG. 4. In one embodiment, the data relating to the selected component is stored in user module data 406 and user project data 404 of FIG. 4. In one embodiment, the data relating to the configuration of the component is stored in user project data 402 of FIG. 4.

In step 1010 of FIG. 10, the interface is utilized to access the stored data. The interface accesses the data stored in device data 402, user module data 406, and user project data 404.

In step 1012 of FIG. 10, the interface is initiated to invoke a processing of the stored data which causes a generation of the application programming interface, as described in FIG. 8. The generated application programming interfaces, as shown in FIG. 9, are for controlling the function of the component in the electronic circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of API (application programming interface) generation for an electronic circuit comprising:
   displaying a graphical user interface through which a user can initiate generation of a new API, wherein said user utilizes said new API to customize functionality of said electronic circuit;
   selecting a component from a plurality of components for placement in said electronic circuit, said component for executing an implementable embedded function in said electronic circuit;
   configuring said selected component via said graphical user interface;
   storing descriptive data relative to said selected component and said configuration;
   utilizing said interface to access said descriptive data; and
   initiating said graphical user interface to invoke a processing of said descriptive data causing an automatic generation of said new API, in response to a user input, said new API comprising a device-interface and interrupt activity framework for source programming and controlling said embedded function of said component in said electronic circuit through user interaction with said new API wherein source code is compiled and built in response to a selection of a graphical element.

2. The method as recited in claim 1 wherein said configuring said selected component comprises placing said selected component in said electronic circuit.

3. The method as recited in claim 1 wherein said configuring said selected component further comprises selling parameters of said selected component, said parameters relative to said function of said component and to said electronic circuit.

4. The method as recited in claim 1 wherein said configuring said selected component further comprises selecting pin values for connecting said component to said electronic circuit.

5. The method as recited in claim 1 wherein said new API comprises header files.

6. The method as recited in claim 1 wherein said new API further comprises assembly code files.

7. The method as recited in claim 1 wherein said new API further comprises include files.

8. The method as recited in claim 1 wherein said data is substantially expressed in extensible markup language.

9. The method as recited in claim 1 wherein said interface comprises a plurality of windows.

10. A computer-readable medium having computer usable program code embodied therein for causing a computer system to perform:
displaying a graphical user interlace through which a user can initiate the generation of an a new API (application programming interface), wherein said user utilizes said new API to customize functionality of an electronic circuit;
selecting a component from a plurality of components for placement in said electronic circuit, said component for executing an implementable embedded function in said electronic circuit;
configuring said selected component via said graphical user interface;
storing descriptive data relative to said selected component and said configuration;
utilizing said graphical user interface to access said descriptive data; and
initiating said graphical user interface to invoke a processing of said descriptive data causing an automatic generation of said new API, in response to a user input, said new API comprising a device-interface and interrupt activity framework for source programming and controlling said embedded function of said component of said electronic circuit through user interaction with said new API wherein source code is compiled and built in response to a selection of a graphical element.

11. The computer-usable medium of claim 10 wherein said configuring said selected component comprises placing said selected component in said electronic circuit.

12. The computer-usable medium of claim 10 wherein said configuring said selected component further comprises setting parameters of said selected component, said parameters relative to said function of said selected component and to said electronic circuit.

13. The computer-usable medium of claim 10 wherein said configuring said selected component further comprises selecting pin values for connecting said selected component to said electronic circuit.

14. The computer-usable medium of claim 10 wherein said new API comprises header files.

15. The computer-usable medium of claim 10 wherein said new API further comprises assembly code files.

16. The computer-usable medium of claim 10 wherein said new API further comprises include files.

17. The computer-usable medium of claim 10 wherein said data is substantially expressed in extensible markup language.

18. The computer-usable medium of claim 10 wherein said graphical user interface comprises a plurality of windows.

19. A computer system comprising;
a bus;
a display device coupled to said bus;
a memory unit coupled to said bus;
a processor coupled to said bus, said processor for executing a method for generating an API (application programming interface) for an electronic circuit comprising:
displaying a graphical user interface through which a user can initiate generation of said a new API, wherein said user utilizes said new API to customize functionality of said electronic circuit;
selecting a component from a plurality of components for placement in said electronic circuit, said component for executing an implementable embedded function in said electronic circuit;
configuring said selected component via said graphical user interface;
storing descriptive data relative to said selected component and said configuration;
utilizing said graphical user interface to access said descriptive data; and
initiating said graphical user interface to invoke said processor to process said stored data causing an automatic generation of said new API, in response to a user input, said new API comprising a device-interface and interrupt activity framework for source programming and controlling said embedded function of said selected component in said electronic circuit through user interaction with said new API wherein source code is compiled and built in response to a selection of a graphical element.

20. The computer system of claim 19 wherein said configuring said selected component comprises placing said selected component in said electronic circuit.

21. The computer system of claim 19 wherein said configuring said selected component further comprises setting parameters of said selected component, said parameters relative to said function of said selected component and to said electronic circuit.

22. The computer system of claim 19 wherein said configuring said selected component further comprises selecting pin values for connecting said selected component to said electronic circuit.

23. The computer system of claim 19 wherein said at API comprises header files.

24. The computer system of claim 19 wherein said new API further comprises assembly code files.

25. The computer system of claim 19 wherein said new API further comprises include files.

26. The computer system of claim 19 wherein said data is substantially expressed in extensible markup language.

27. The computer system of claim 19 wherein said graphical user interface comprises a plurality of windows.

* * * * *